United States Patent
Kawakami et al.

(10) Patent No.: US 6,804,900 B2
(45) Date of Patent: Oct. 19, 2004

(54) METHOD FOR DRYING MICROSTRUCTURE MEMBER

(75) Inventors: Nobuyuki Kawakami, Kobe (JP); Toshiro Kugimiya, Kobe (JP)

(73) Assignee: Kabushiki Kaisha Kobe Seiko Sho, Hyogo (JP)

( * ) Notice: Subject to any disclaimer, the term of this patent is extended or adjusted under 35 U.S.C. 154(b) by 0 days.

(21) Appl. No.: 10/636,777

(22) Filed: Aug. 8, 2003

(65) Prior Publication Data

US 2004/0038532 A1 Feb. 26, 2004

(30) Foreign Application Priority Data

Aug. 22, 2002 (JP) ........................................ 2002-242012

(51) Int. Cl.⁷ .................................................. F26B 3/00
(52) U.S. Cl. .............................. 34/351; 34/405; 34/413
(58) Field of Search .......................... 34/351, 352, 348, 34/402, 405, 410, 413

(56) References Cited

U.S. PATENT DOCUMENTS

| | | | |
|---|---|---|---|
| 6,398,875 B1 * | 6/2002 | Cotte et al. ..................... | 134/2 |
| 6,554,507 B2 * | 4/2003 | Namatsu ..................... | 396/611 |
| 6,562,146 B1 * | 5/2003 | DeYoung et al. .............. | 134/30 |
| 6,602,351 B2 * | 8/2003 | DeYoung et al. .............. | 134/36 |
| 6,613,157 B2 * | 9/2003 | DeYoung et al. .............. | 134/36 |

FOREIGN PATENT DOCUMENTS

JP  2001-165568  12/1999

* cited by examiner

*Primary Examiner*—Kenneth Rinehart
(74) *Attorney, Agent, or Firm*—Reed Smith LLP; Stanley P. Fisher, Esq.; Juan Carlos A. Marquez, Esq.

(57) ABSTRACT

Method for drying a microstructure member having many micro concavities in a surface, the micro concavities containing water, includes adjusting the temperature of liquid inside the micro concavities to a temperature in the range of the cloud point of a surfactant ±1° C., and supplying a mixture of the surfactant and a hydrophobic solvent adjusted to a temperature in the range of the cloud point ±1° C. into the micro concavities to remove part or all of the water; heating the liquid inside the micro concavities to a temperature exceeding the cloud point +1° C., and supplying the hydrophobic solvent controlled to a temperature exceeding the cloud point +1° C. into the micro concavities to replace the liquid in the concavities with the hydrophobic solvent; and placing the resulting microstructure member with the concavities into contact with liquid or supercritical carbon dioxide to replace the hydrophobic solvent with the liquid or supercritical carbon dioxide.

4 Claims, No Drawings

METHOD FOR DRYING MICROSTRUCTURE MEMBER

BACKGROUND OF THE INVENTION

1. Field of the Invention

The present invention relates to a method for drying a microstructure member, such as a semiconductor substrate, that has a fine irregular surface (microstructure surface) using liquid carbon dioxide or supercritical carbon dioxide. In particular, it relates to a method for drying a microstructure member without causing micro patterns to swell or collapse.

2. Description of the Related Art

In a lithographic process of a semiconductor manufacturing process, patterns formed using a photoresist material often collapse when the patterns are dried to remove a developer or a rinsing solution remaining in the pattern (concavities) after development. This problematic phenomenon of collapse of patterns is caused by the volume expansion of the developer or the rinsing solution resulting from heat applied during the drying. However, the phenomenon is also caused by a capillary force that attracts the patterns to each other during drying. The phenomenon is becoming more acute as the patterns become increasingly finer and the aspect ratio becomes increasingly larger (i.e., as the height becomes larger relative to the width).

In order to minimize the adverse affects of capillary force and volume expansion during drying, a drying method that uses a supercritical fluid has been investigated. This method can dry microstructure members such as wafers in a capillary-force-free state since a supercritical fluid having a temperature and a pressure exceeding the critical points has no gas-liquid interface.

In this supercritical drying method, carbon dioxide, which has a critical temperature and a critical pressure dramatically lower than those of water, is widely used as the supercritical fluid. Supercritical carbon dioxide is a good solvent that can dissolve highly polar solvents such as methanol, ethanol, and isopropanol as well as less polar solvents such as hexane or fluorocarbons. Thus, when any one of these solvents is used as the developer or the rinsing solution for the resist material, supercritical carbon dioxide can extract and remove the developer or the rinsing solution from inside the patterns, thereby drying the microstructure member, such as a wafer.

However, in the field of semiconductor LSI, a resist material that is developed with aqueous tetramethylammonium hydroxide (TMAH) instead of the above-described organic solvents is more commonly used. In such a case, water, i.e., ultrapure water, is used as the rinsing solution. Since water is not miscible with in supercritical carbon dioxide, water inside the patterns must be replaced with a liquid miscible with supercritical carbon dioxide in order to perform drying with supercritical carbon dioxide.

Water can be easily replaced by using a hydrophilic organic solvent such as ethanol. However, the resist material developed with an aqueous solution described above dissolves in alcohols such as ethanol. Thus, alcohols cannot be used as the liquid for replacing the water.

On the other hand, hexane and fluorocarbons are not miscible with water and thus cannot replace water. To overcome these difficulties, Japanese Unexamined Patent Application Publication No. 2001-165568 teaches a technology for completely substituting water into aliphatic hydrocarbon by emulsifying the water with aliphatic hydrocarbon, such as hexane, using a surfactant, such as a fatty acid ester. However, the publication does not disclose a specific method for emulsifying water with aliphatic hydrocarbon. Emulsification by mechanical, forced agitation may result in collapse of patterns, and thus cannot be employed in the semiconductor manufacturing process. On the other hand, a complete emulsification state cannot be achieved without agitation. When emulsification is incomplete, an interfacial tension still exists at the interface between water and aliphatic hydrocarbon and causes collapse of patterns due to the capillary force between the adjacent patterns.

SUMMARY OF THE INVENTION

Accordingly, an object of the present invention is to provide a drying method in which water inside concavities of the microstructure member, e.g., water remaining in the pattern, is substituted with a hydrophobic solvent miscible with supercritical carbon dioxide in a capillary-force-free state to prevent collapse of patterns and the like.

To achieve this object, the present invention provides a method for drying a microstructure member having a large number of micro concavities in a surface, the micro concavities containing water, the method including the steps of (1) adjusting the temperature of a liquid inside the micro concavities to a temperature in the range of the cloud point of a surfactant (A) ±1° C., and supplying a large amount of a mixture of the surfactant (A) and a hydrophobic solvent (B) adjusted to a temperature in the range of the cloud point of the surfactant (A) ±1° C. into the micro concavities to remove part or all of the water inside the micro concavities; (2) heating the liquid inside the micro concavities to a temperature exceeding the cloud point of the surfactant (A) +1° C., and supplying a large amount of the hydrophobic solvent (B) controlled to a temperature exceeding the cloud point of the surfactant (A) +1° C. into the micro concavities to replace the liquid in the concavities with the hydrophobic solvent (B); and (3) placing the microstructure member with the concavities containing the hydrophobic solvent (B) into contact with liquid carbon dioxide or supercritical carbon dioxide to replace the hydrophobic solvent (B) with the liquid carbon dioxide or the supercritical carbon dioxide. Steps (1) and (2) are performed under atmospheric pressure.

Since the surfactant (A) having a cloud point is used and the water is replaced with the hydrophobic solvent (B) at a temperature in the range of the cloud point ±1° C., the water is replaced with the hydrophobic solvent (B) in an interfacial-tension-free state to prevent collapse of the microstructure such as a pattern.

In Step (1) above, the mixture of the surfactant (A) and the hydrophobic solvent (B) may be supplied to the surface of the microstructure member while rotating the microstructure member. In this manner, the water can be readily replaced with the hydrophobic solvent (B).

In Step (1) above, prior to supplying the mixture into the micro concavities, an aqueous solution of the surfactant (A) controlled to a temperature less than or equal to the cloud point of the surfactant (A) +1° C. may be supplied into the micro concavities. In this manner, the replacement with the hydrophobic solvent (B) in an interfacial-tension-free state can be easily performed.

The surfactant (A) preferably has a cloud point in the range of 10 to 100° C. from the viewpoint of damage to a resist material, energy cost, and boiling point of water.

The present invention also includes a microstructure member dried by the method according to the method described above.

According to the present invention, water remaining on the surface of the microstructure member can be replaced with a hydrophobic solvent having a high affinity to carbon dioxide in an interfacial-tension-free state prior to liquid/supercritical carbon dioxide treatment. Thus, the patterns of the microstructure member can be prevented from collapsing.

DESCRIPTION OF THE PREFERRED EMBODIMENTS

The present invention provides a method for drying a microstructure member. An example of the microstructure member is an article, such as a semiconductor substrate, with a fine irregular surface formed by development of a photoresist. However, the microstructure member is not limited to the semiconductor substrate. The drying method may be used to prepare articles of metal, plastic, ceramic, or the like having clean dry surfaces.

The drying method of the present invention is based on the assumption that water is contained inside the micro concavities at the surface of the microstructure member. In a typical semiconductor wafer manufacturing process, a resist pattern is developed with aqueous tetramethylammonium hydroxide (TMAH). In such a case, the TMAH developer is removed by rinsing with water (ultrapure water). Since the present invention provides a method for drying a microstructure after the step of rinsing with water, it is a prerequisite of the present invention that the water is retained inside micro concavities at the surface of the member.

The drying method of the present invention essentially includes three steps, i.e., Steps (1) to (3), described in detail below. Before explaining details of the method, a surfactant (A) having a cloud point and a hydrophobic solvent (B) miscible with liquid or supercritical carbon dioxide are explained.

The term "cloud point" of the surfactant (A) refers to a temperature at which a solution becomes clouded due to precipitation of hydrous crystals of the surfactant as the solubility of the nonionic surfactant in water decreases with an increase in temperature.

In the present invention, a nonionic surfactant highly hydrophilic below the cloud point and highly hydrophobic above the cloud point is used as the surfactant (A).

Examples of the surfactant (A) include ethers such as polyoxyalkylene alkyl phenyl ethers (polyoxyethylene octylphenyl ether, polyoxyethylene nonylphenyl ether, and the like) and glycol ethers; esters such as sorbitan fatty acid esters (sorbitan monolaurate, sorbitan monooleate, and the like), polyoxyalkylene sorbitan fatty acid esters (polyoxyethylene sorbitan monolaurate, polyoxyethylene sorbitan monooleate, and the like), fatty acid monoglycerides (stearic acid monoglyceride, oleic acid monoglyceride, and the like), and polyethylene glycol fatty acid esters (diethylene glycol lauric acid ester, propylene glycol monooleic acid ester, and the like); amines such as polyoxyalkylene alkylamines (polyoxyethylene lauryl stearylamine and the like); amines such as polyoxyalkylene alkylamides (polyoxyethylene stearylamine and the like); condensates of higher alcohols and polyoxyalkylene; and polymers such as polyoxyethylene-oxypropylene condensates (pluronic type or tetronic type). These may be used alone or in combination.

The cloud point of the above nonionic surfactants varies depending on the moles of oxyalkylene (alkylene oxide) per mole of the surfactant. The cloud point increases with the moles of oxyalkylene per mole of the surfactant. The cloud point is preferably lower than the boiling point of water (100° C.). Preferably, the cloud point of the surfactant (A) is in the range of 10 to 100° C., and more preferably, 20 to 60° C. to minimize the damage caused to the resist material and to reduce the energy cost. In view of the above, the surfactant (A) is preferably polypropylene glycol, a polyoxypropylene/polyoxyethylene condensate, or an alkyl ether or an alkyl ester of any of these having 30 to 50 moles of oxyalkylene.

An example of the surfactant having a cloud point of 25° C. is shown by the formula below. In the formula, m+n=7.

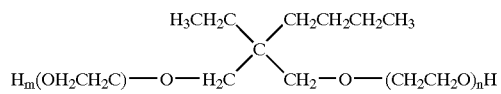

Note that the cloud points of the above-described surfactants are indicated in their product information if the surfactants are commercially available. The data on cloud point can also be found in literature concerning surfactants.

The hydrophobic solvent (B) miscible with liquid carbon dioxide or supercritical carbon dioxide may be any solvent as long as it does not mix with water under atmospheric pressure but mixes with liquid carbon dioxide or supercritical carbon dioxide under a high pressure. Examples thereof include, aliphatic hydrocarbons such as pentane, hexane, octane, and the like; alicyclic hydrocarbons such as cyclohexane; aromatic hydrocarbons such as toluene, benzene, xylene, and the like; hydrofluoroethers such as $C_4F_9OCH_3$ (e.g., "HFE7100" manufactured by Sumitomo 3M) and $C_4F_9OC_2H_5$ (e.g. "HFE7200" manufactured by Sumitomo 3M); fluorocarbon solvents of Florinert (Trademark) series manufactured by Sumitomo 3M such as "FC-40", "FC-43", "FC-70", "FC-72", "FC-75", "FC-77", "FC-84", "FC-87", "FC-3283", and "FC-5312"; and halogenated hydrocarbons such as dichloroethane.

The drying method of the present invention will now be described.

In Step 1, the temperature of the liquid inside the micro concavities is adjusted to a temperature in the range of the cloud point of the surfactant (A) ±1° C. A large amount of a mixture of the surfactant (A) and a hydrophilic solvent (B) adjusted to a temperature in the range of the cloud point of the surfactant (A) ±1° C. is fed inside the micro concavities to remove part or all of water inside the concavities.

In the temperature range of the cloud point of the surfactant (A) ±1° C., the interfacial tension between water and the hydrophobic solvent (B) decreases to substantially zero (free of surface tension) by a surface-tension reducing effect of the surfactant (A). As a result, when the mixture of the surfactant (A) and the hydrophobic solvent (B) is continuously supplied in a large amount inside the concavities, water flows out of the concavities in an interfacial-tension-free state, thereby removing water inside the concavities. Preferably, all of the water is removed in Step 1; however, some of the water may remain inside the concavities since water can be removed in a reversed micelle state in the subsequent Step 2.

In Step 1, water inside the concavities is replaced by the mixture of the surfactant (A) and the hydrophobic solvent (B). Since water is replaced with the hydrophobic solvent (B) in an interfacial-tension-free state, no force is applied to the micro patterns, and collapse of the patterns can be prevented. However, in order to maintain the interfacialtension-free state, the temperature of the liquid inside the concavities and that of the mixture of the surfactant (A) and the hydrophobic solvent (B) must be tightly controlled within the range of the cloud point of the surfactant (A) ±1° C., and more preferably within the range of the cloud point of the surfactant (A) ±0.5° C.

The surfactant (A) may be supplied to the concavities not only as the mixture with the hydrophobic solvent (B) but also as an aqueous solution. When the aqueous solution of the surfactant (A) is used, the aqueous solution may be supplied inside the micro concavities in advance. The aqueous solution of the surfactant (A) may be supplied at a temperature lower than or equal to the cloud point of the surfactant (A) +1° C. At least two methods are available for supplying the aqueous solution of the surfactant (A) at a temperature lower than or equal to the cloud point of the surfactant (A) +1° C. One method is to adjust the aqueous solution of the surfactant (A) to a temperature within the range of the cloud point of the surfactant (A) ±1° C. and thereby supplying the aqueous solution in an interfacial-tension-free state. The other method is to supply the aqueous solution at a temperature less than the cloud point −1° C. and then heating the liquid inside the concavities to a temperature within the range of the cloud point ±1° C. prior to performing Step 1 above. Any of the two methods may be employed.

At a temperature below the cloud point, the surfactant (A) is highly hydrophilic and readily dissolves in/mixes with water, thereby forming a solution. By allowing the surfactant (A) to dissolve in the water inside the concavities in advance, the interfacial-tension-free state can be readily achieved in Step 1 above, and water can be smoothly substituted with the hydrophobic solvent (B).

The mixture of the surfactant (A) and the hydrophobic solvent (B), and the surfactant (A) aqueous solution are supplied to the concavities by, for example, one of the following specific methods: (1) a spin coating method of supplying the feed from a nozzle or the like to the surface of the microstructure member while rotating the microstructure member; (2) a method of supplying the feed on the entire surface of the microstructure member by showering without rotating the microstructure member; and (3) a method of dipping the microstructure member in a container retaining the feed.

Method (1) above is most preferred since water can be easily removed and substituted with the feed by centrifugal force. The speed of rotation may be any but is preferably 100 to 5,000 rpm. When method (2) or (3) above is employed, it is preferable to use a feed having a specific gravity different from that of water. In method (2) above, a halogenated hydrocarbon solvent or a fluorocarbon solvent having a large specific gravity may be used as the hydrophobic solvent (B). In this manner, since the heavy solvent settles at the bottom of the concavities to lift up the water, the water can be easily removed from the concavities. In method (3) above, the same advantages as those of method (2) can be achieved by using the hydrophobic solvent (B) with a large specific gravity. In cases where a hydrophobic solvent (B) with a smaller specific gravity is used, the position of the article may be vertically flipped before dipping the article in the feed solution.

In Step 1, the amount of the surfactant (A) in the mixture of the surfactant (A) and the hydrophobic solvent (B) is preferably 0.01 to 10 mass %, and more preferably 0.1 to 7.5 mass %. In cases where the aqueous solution of the surfactant (A) is optionally supplied in the concavities in advance, the amount of the surfactant (A) in the aqueous solution is preferably in the range of 0.02 to 20 mass %, and more preferably 0.2 to 15 mass %

Step 1 may require any amount of time. When method (1) above is employed, the time is preferably 1 to 10 seconds. When method (2) above is employed, the time is preferably 1 to 3 minutes. When the method (3) is employed, the time is preferably 1 to 5 minutes. Step 1 and the subsequent Step 2 may be performed under atmospheric pressure.

Upon completion of Step 1, Step 2 is performed. In Step 2, the liquid inside the concavities is heated to a temperature exceeding the cloud point of the surfactant (A) +1° C., and a large amount of the hydrophobic solvent (B) adjusted to a temperature exceeding the cloud point of the surfactant (A) +1° C. is supplied inside the concavities so as to replace the liquid inside the concavities with the hydrophobic solvent (B).

The surfactant (A) becomes hydrophobic at a temperature exceeding the cloud point +1° C. Thus, the surfactant (A) dissolves in/mixes with the hydrophobic solvent (B), thereby forming a solution. As a result of supplying the large amount of the hydrophobic solvent (B) at a temperature exceeding the cloud point +1° C., the solution is discharged from the concavities, and only the hydrophobic solvent (B) remains in the concavities, thereby completing the substitution with the hydrophobic solvent (B). Here, a trace amount of the surfactant (A) may remain since the surfactant (A) can be removed in the subsequent step, i.e., Step 3.

In Step 2, since the surfactant (A) is dissolved in/mixes with the hydrophobic solvent (B) to give a solution, and this solution is removed by the hydrophobic solvent (B), interfacial tension rarely works between the solution and the hydrophobic solvent (B). Thus, no adverse effect is posed on the patterns. Moreover, even when a trace amount of water remains in the concavities in Step 2 due to insufficient water removal in Step 1, stable droplets can be formed in the continuous phase of the hydrophobic solvent (B) by the surfactant (A) when the liquid in the concavities is heated to a temperature exceeding the cloud point +1° C. (reversed micelle). Since these droplets are removed from the concavities in Step 2, water can be completely removed. Since the amount of water remaining in the concavities after Step 1 is small, the amount of droplets formed in Step 2 is also small. Thus, the influence of the interfacial tension of the reversed micelle on the patterns is dramatically small. The patterns therefore do not collapse.

In order to accelerate dissolution/mixing of the surfactant (A) into the hydrophobic solvent (B), the temperature of the liquid inside the concavities and the temperature of the feed solution in Step 2 are preferably more than or equal to the cloud point +2° C., and more preferably more than or equal to the cloud point +5° C. The time required for Step 2 is the same as in Step 1 described above.

Upon completion of Step 2, Step 3 is performed. In Step 3, the microstructure member having micro concavities filled with the hydrophobic solvent (B) is put into contact with liquid carbon dioxide or supercritical carbon dioxide to replace the hydrophobic solvent (B) with the liquid carbon dioxide or the supercritical carbon dioxide.

Upon completion of Step 2, the micro concavities of the article are filled only with the hydrophobic solvent (B). In Step 3, the microstructure member is placed in a high-pressure chamber. The chamber is charged with liquid carbon dioxide or supercritical carbon dioxide so as to put the microstructure member in contact with the liquid/supercritical carbon dioxide. In this manner, the hydrophobic solvent (B) is removed from the concavities of the microstructure of the article by substituting the liquid inside the concavities with the liquid/supercritical carbon dioxide. Since the hydrophobic solvent (B) is miscible with the liquid/supercritical carbon dioxide, and the liquid/supercritical carbon dioxide easily enters inside the concavities of the micro pattern, the patterns remain unaffected also in this substitution step.

After the completion of Step 2 and before the microstructure member is placed in the high-pressure chamber, the microstructure member is put under atmospheric pressure. During this time, the adverse affect on the patterns may be caused by evaporation of the hydrophobic solvent (B). Thus, the surface of microstructure member is preferably covered with the hydrophobic solvent (B) before being placed in the high-pressure chamber. In other words, the surface of the microstructure after Step 2 is preferably completely wet with the hydrophobic solvent (B), i.e., completely covered with the hydrophobic solvent (B), and the microstructure member is preferably transferred to the chamber as rapidly as possible. Alternatively, the microstructure member may be immersed in the hydrophobic solvent (B) if Step 3 is not performed immediately after Step 2.

After the hydrophobic solvent (B) in the concavities is completely substituted with the liquid/supercritical carbon dioxide in Step 3, the pressure inside the chamber is decreased to atmospheric pressure during which the liquid/supercritical carbon dioxide evaporates from the surface of the microstructure to complete drying. By decreasing the pressure inside the chamber to atmospheric pressure, carbon dioxide rapidly evaporates, thereby completing the drying without collapsing the patterns. Note that the carbon dioxide in the chamber before decreasing the pressure is preferably in a supercritical state. Since the pressure is decreased to atmospheric pressure via the gas phase only, the collapse of patterns can be reliably prevented.

Liquid carbon dioxide is carbon dioxide pressurized at 5 MPa or more. In order to prepare supercritical carbon dioxide, the temperature should be at least 31.2° C. and the pressure should be at least 7.1 MPa. The pressure during the drying step is preferably 5 to 30 MPa, and more preferably 7.1 to 20 MPa. The temperature during the drying step is preferably 31.2 to 120° C. At a temperature less than 31.2° C., the hydrophobic solvent (B) becomes less miscible with carbon dioxide. Thus, the time required for removing the hydrophobic solvent (B) from the surface of the microstructure becomes longer, and the efficiency of drying step is degraded. On the other hand, the efficiency of drying does not improve at a temperature exceeding 120° C. The time taken for drying may be changed according to the size of the article. In general, the time is several minutes to several tens of minutes.

EXAMPLES

The present invention will now be described by way of examples. The examples below do not limit the scope of the present invention, and various modifications are possible without departing from the scope of the invention. Unless otherwise noted, "part" means "part by mass", and "%" means "mass %".

Example 1

A silicon wafer was spin-coated with a photoresist "UV2" manufactured by Shipley Company L.L.C., at 3,000 rpm to form a resist film having a thickness of 4,000 Å. The wafer with the resist film was prebaked at 130° C. for 90 seconds, patterned by electron beam irradiation (electron beam acceleration voltage: 50 keV; electron irradiation dose: 10 $\mu C/cm^2$), and was baked at 140° C. for 90 sec. The wafer with the irradiated resist film was developed for 1 minute using a developer (2.38% tetramethylammonium hydroxide aqueous solution). Upon completion of the development, ultrapure water was supplied to the wafer surface while rotating the wafer to wash out the developer.

Subsequently, without allowing the wafer surface to dry, a 1% aqueous solution of nonionic surfactant having a cloud point of 25° C. represented by the formula below was supplied to the wafer surface while rotating the wafer (200 rpm) to completely substitute the rinsing solution with the aqueous solution of the surfactant. The temperature of the aqueous solution was 23° C.

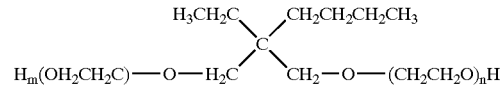

wherein m+n=7.

The wafer was then heated to 25° C., i.e., the cloud point, and maintained at this temperature for 10 seconds. Hexane controlled at 25° C. containing 1% of the above surfactant was supplied onto a wafer rotating at 200 rpm for 10 seconds to remove the aqueous solution of the surfactant. The wafer was next heated to 27° C., and hexane controlled at 27° C. was supplied onto the wafer rotating at 200 rpm for 30 seconds (Step 2).

The rotation of the wafer was stopped, and hexane was supplied to the surface of the wafer to prevent the wafer surface from drying. The wafer was placed in a high-pressure chamber maintained at 35° C. While supplying carbon dioxide preheated to 35° C. to the chamber via a liquid-feeding pump, the carbon dioxide in the chamber was adjusted at 8 MPa by a pressure-controlling valve so as to produce supercritical carbon dioxide in the chamber. The supercritical carbon dioxide was continuously supplied into the chamber by the pressure-controlling valve, while the super critical carbon dioxide mixed with hexane was discharged through the valve to remove hexane from the chamber, thereby filling the chamber only with the supercritical carbon dioxide (Step 3). While maintaining the temperature at 35° C., the pressure inside the chamber was reduced to atmospheric pressure so as to dry the wafer having the resist film. The resist pattern was observed with an electron microscope. No collapse of patterns was observed.

For the purpose of the comparison, a sample dried by spinning at 2,000 rpm directly after the wafer with the developed resist pattern was rinsed with ultrapure water was prepared. The sample was also observed with an electron microscope. All of the patterns were collapsed.

Example 2

Formation of a resist pattern, development, and rinsing with ultrapure water were performed as in Example 1. Next, the wafer was heated to 25° C. and was maintained thereat for 10 seconds. A hexane solution at 25° C. containing 1% of the above-described surfactant was supplied to the surface of the wafer rotating at 200 rpm for 10 seconds to remove water (Step 1). The subsequent steps, i.e., Steps 2 and 3, were the same as those of Example 1. The dried wafer was observed with an electron microscope. No collapse of patterns was observed.

What is claimed is:

1. A method for drying a microstructure member having a large number of micro concavities in a surface, the micro concavities containing water, the method comprising the steps of:

(1) adjusting the temperature of a liquid inside the micro concavities to a temperature in the range of the cloud point of a surfactant (A) ±1° C., and supplying a large amount of a mixture of the surfactant (A) and a hydrophobic solvent (B) adjusted to a temperature in the range of the cloud point of the surfactant (A) ±1° C. into the micro concavities to remove part or all of the water inside the micro concavities;

(2) heating the liquid inside the micro concavities to a temperature exceeding the cloud point of the surfactant (A) +1° C., and supplying a large amount of the hydrophobic solvent (B) controlled to a temperature exceeding the cloud point of the surfactant (A) +1° C. into the micro concavities to replace the liquid in the concavities with the hydrophobic solvent (B); and (3) placing the microstructure member comprising the concavities containing the hydrophobic solvent (B) into contact with liquid carbon dioxide or supercritical carbon dioxide to replace the hydrophobic solvent (B) with the liquid carbon dioxide or the supercritical carbon dioxide, wherein Steps (1) and (2) are performed under atmospheric pressure.

2. The method according to claim 1, wherein, in Step (1), the mixture of the surfactant (A) and the hydrophobic solvent (B) is supplied to the surface of the microstructure member while rotating the microstructure member.

3. The method according to claim 1, wherein, in Step (1), prior to supplying the mixture into the micro concavities, an aqueous solution of the surfactant (A) controlled to a temperature less than or equal to the cloud point of the surfactant (A) +1° C. is supplied into the micro concavities.

4. The method according to claim 1, wherein the cloud point of the surfactant (A) is in the range of 10 to 100° C.

* * * * *